United States Patent
Atobe

(10) Patent No.: US 7,780,784 B2
(45) Date of Patent: Aug. 24, 2010

(54) MOLDING ASSEMBLY FOR FORMING INGOT AND A METHOD OF FORMING INGOT

(75) Inventor: Junichi Atobe, Shiga (JP)

(73) Assignee: Kyocera Corporation, Kyoto (JP)

( * ) Notice: Subject to any disclaimer, the term of this patent is extended or adjusted under 35 U.S.C. 154(b) by 1145 days.

(21) Appl. No.: 11/418,066

(22) Filed: May 5, 2006

(65) Prior Publication Data

US 2006/0249650 A1 Nov. 9, 2006

(30) Foreign Application Priority Data

May 6, 2005 (JP) .............................. 2005-134936

(51) Int. Cl.
*C30B 11/02* (2006.01)
(52) U.S. Cl. ............................ 117/223; 117/82; 117/83; 117/84; 164/122.2; 164/169
(58) Field of Classification Search ................... 117/82, 117/83, 84, 223; 164/122.2, 169
See application file for complete search history.

(56) References Cited

U.S. PATENT DOCUMENTS 5,454,424 A * 10/1995 Mori et al. ................... 164/469
2005/0241570 A1 * 11/2005 Lebbou et al. ................ 117/81

FOREIGN PATENT DOCUMENTS

JP 2001300950 * 10/2001

* cited by examiner

*Primary Examiner*—Robert M Kunemund
(74) *Attorney, Agent, or Firm*—Oblon, Spivak, McClelland, Maier & Neustadt, L.L.P.

(57) ABSTRACT

A molding assembly for forming an ingot, including side members each having engaging end portions, the engaging end portions of the side members being engaged with respective ones of the side members such that the side members form a polygonal prism having sides, corners, a top opening and a bottom opening, the engaging end portions of the side members engaging to form connecting portions positioned in the sides, and a bottom member fitted to close the bottom opening of the polygonal prism so as to form a molding device for molding a molten material into an ingot.

21 Claims, 15 Drawing Sheets

MOLDING ASSEMBLY FOR FORMING INGOT AND A METHOD OF FORMING INGOT

CROSS-REFERENCE TO RELATED APPLICATIONS

The present application claims priority to Japanese Patent Application Serial No. 2005-134936, filed on May 6, 2005. The contents of that application are incorporated herein by reference in their entirety.

BACKGROUND OF THE INVENTION

1. Field of the Invention

The present invention relates to a molding device for forming an ingot from a molten material, and a method of forming an ingot from a molten material.

2. Discussion of the Background

As a clean energy source alternative to petroleum oil, practical use of solar batteries has been sought in an extensive field ranging from a small-scaled house hold use to a large-scaled power generation system. These solar batteries are classified into a crystal type, an amorphous type, and a compound type in accordance with types of materials used, and among them, a majority of the solar batteries currently distributed in the market are crystal type silicon solar batteries. These crystal type silicon solar batteries are further categorized into a single crystal type and a polycrystalline type. In a single crystal silicon solar battery, since the substrate has a good quality, it is easy to make the conversion efficiency higher. However, a cost of manufacturing the substrate is high. On the other hand, the demand of the polycrystalline silicon solar battery has been increased while the concern for the environmental issues is growing, and the polycrystalline silicon solar battery has been desired to have higher conversion efficiency at much lower cost.

In the polycrystalline silicon solar battery, there are methods of forming polycrystalline silicon ingots as follows. In one method, a molten material obtained by heat-melting silicon is poured into a molding device, and the molten material is solidified in one direction from the bottom of the molding device, to thereby form the silicon ingot. In another method, a raw silicon material is supplied into a molding device and melted, and then the molten material is solidified from the bottom of the molding device, to thereby form a polycrystalline silicon ingot. In the ingots obtained as described above, their side portions or bottom portion contain many defects and impurities, and impurities due to solidification segregation are concentrated in the top portion of the ingot. Those portions are usually cut and removed in several mm or more in thickness, and by slicing those ingots thin using a multi-wire saw or the like, they are processed into polycrystalline silicon substrates for solar batteries.

In "A NEW DIRECTIONAL SOLIDIFICATION TECHNIQUE FOR POLYCRYSTALLINE SOLAR GRADE SILICON", 15th Photovoltaic Specialist Conf. (1981), P576~P580, there has been used a molding device which is made of graphite and silicon dioxide such as quartz and fused silica, and in which a mold release material coating containing a silicon nitride, a silicon dioxide, or the like is formed inside. In the molding device made of fused silica, during a process of cooling a block from the high-temperature state, the molding device is cracked due to the temperature gradient and difference of the sintering state inside the molding device, making it difficult to recycle the molding device. Also, in the molding device made of the quartz, a surface layer of the inner surface of the molding device coated with the mold release material becomes cristobalite, and the surface layer is peeled, causing wearing of the molding device and making it extremely difficult to recycle. Thus, the yield of the manufactured silicon ingots is poor.

Also, in Japanese Unexamined Patent Publication No. 10-190025, in order to remove a silicon ingot from an integral type molding device without breaking the molding device, there has been proposed a method for providing a larger taper on the inner surface of the molding device. Accordingly, the side surfaces of a silicon ingot cast by this molding device have an inverted taper expanding from the bottom of the ingot toward the top, thereby increasing edge portions which cannot be used as products. Therefore, expensive raw silicon materials are removed excessively.

In Japanese Unexamined Patent Publication No. 62-108515, there has been proposed a method for forming a molding device, in which high purity graphite is used for forming a bottom member and side members in plate forms, and then these bottom and side members are assembled and fixed by screws.

In Japanese Unexamined Patent Publication No. 6-144824, there has been proposed a method in which a silica powder layer is provided in a mold release material coated inside a molding device, and thus a stress due to the solidification expansion of silicon is absorbed by the softening deformation of the silica powder layer. Further, in Japanese Unexamined Patent Publication No. 10-182285, there has been proposed a method in which a wall thickness of a side member of a molding device is varied, utilizing that a surface with a small thickness is easily deformed and that a direction of a stress generated due to the solidification expansion of silicon is set to be in a direction of a tensile stress of a screw, to thereby prevent breakages of the screws.

The contents of the aforementioned references are incorporated herein by reference in their entirety.

SUMMARY OF THE INVENTION

According to one aspect of the present invention, a molding assembly for forming an ingot includes side members and a bottom member. Each of the side members has engaging end portions and the engaging end portions of the side members are engaged with respective ones of the side members. The side members form a polygonal prism having sides, corners, a top opening and a bottom opening. The engaging end portions of the side members engage to form connecting portions positioned in the sides of the polygonal prism, and the bottom member is fitted to close the bottom opening of the polygonal prism so as to form a molding device for molding a molten material into an ingot.

According to another aspect of the present invention, a method of forming an ingot includes providing a molding assembly including side members each having engaging end portions, the engaging end portions of the side members being engaged with respective ones of the side members such that the side members form a polygonal prism having sides, corners, a top opening and a bottom opening, the engaging end portions of the side members engaging to form connecting portions positioned in the sides, a bottom member fitted to close the bottom opening of the polygonal prism so as to form a molding device for molding a molten material into an ingot, pouring the molten material into the molding device, and cooling the molten material sufficiently such that the molten material crystallizes to form an ingot.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
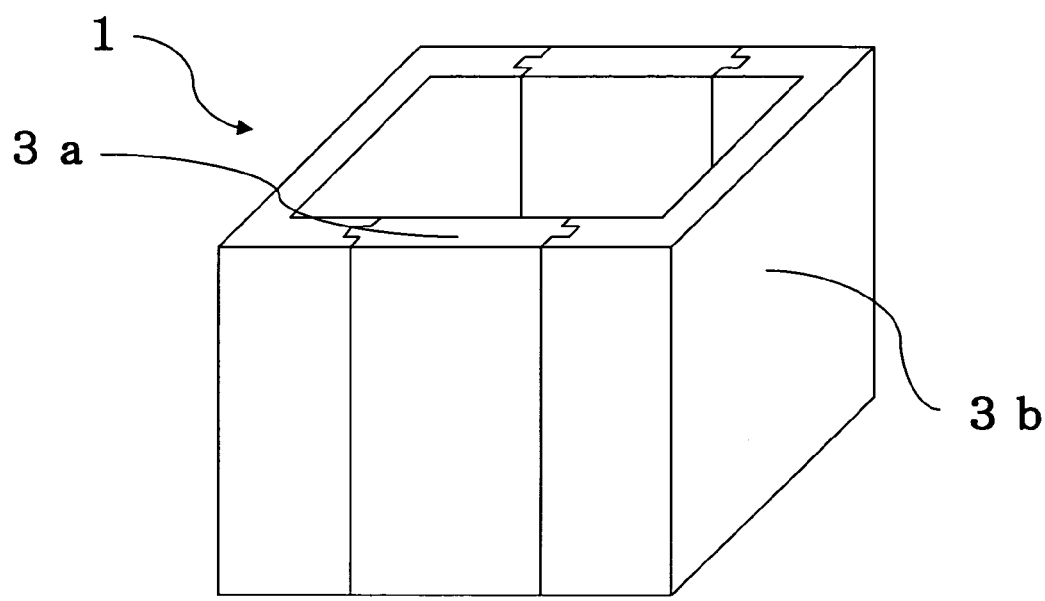
FIG. 1 is a perspective view of a molding device according to an embodiment of the present invention.

The embodiments will now be described with reference to the accompanying drawings, wherein like reference numerals designate corresponding or identical elements throughout the various drawings.

Figure 2:
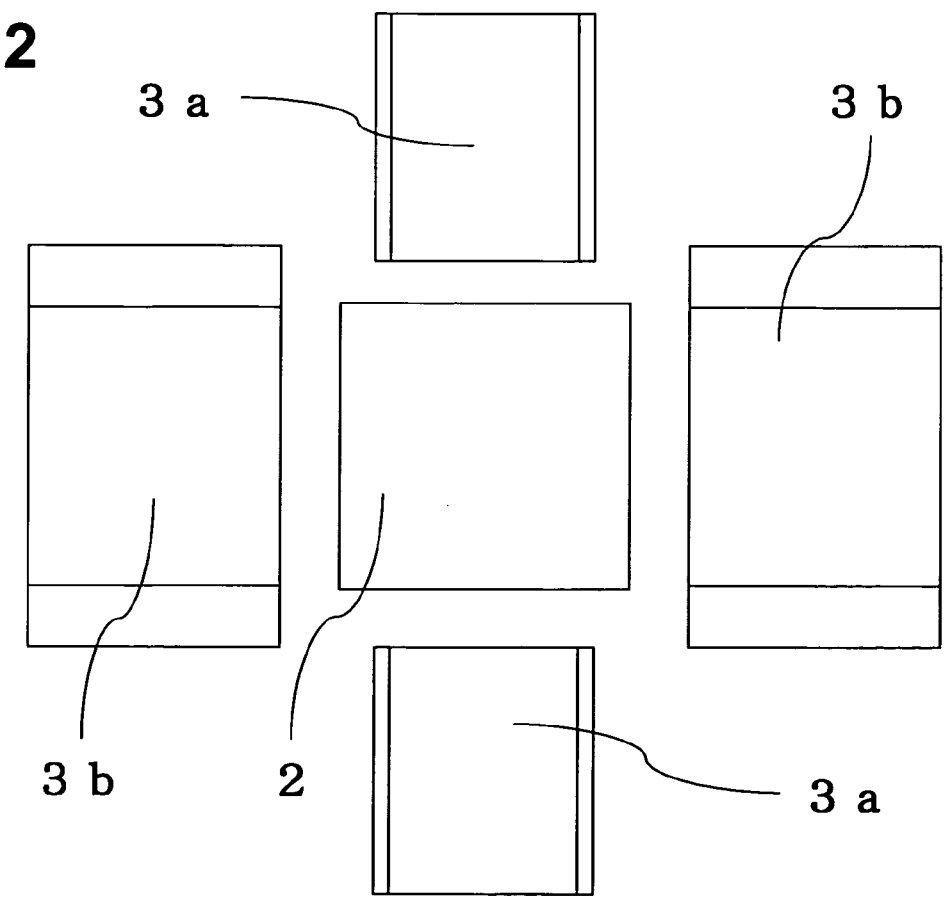
FIG. 2 is an exploded view of the molding device shown in FIG. 1.

FIG. 1 shows a perspective view of a molding device according to an embodiment of the present invention, and FIG. 2 shows an exploded view thereof. In FIG. 1 and FIG. 2, a molding device 1 has a bottom member 2 and multiple side members 3 including first side members (3a) and second side members (3b) disposed adjacent to the first side members (3a). The members or components of a molding device are generally referred to as "members," for example, "side members" and "bottom members."

The molding device 1 is made of, for example, a graphite, and has a polygonal shape formed of the bottom member 2 and multiple side members 3. The side members 3 include the side members (3a, 3b) positioned adjacent to each other, and the side members (3a, 3b) are connected or engaged to each other at the sides of the polygonal prism.

In the case of the molding device having its side members abutting against the bottom member 2 as shown in FIGS. 1 and 2, the first side member (3a) constituting two faces facing against each other are rectangular plates, i.e., single-sided plates, and the second side members (3b) constituting the other two faces facing against each other are U-shaped plates formed of three faces, i.e., three-sided plates. The molding device 1 has a polygonal shape in its plan view, and at at least one of the sides forming this polygonal shape, the first side member (3a) and the second side member (3b) are connected or engaged to each other, thereby forming the molding device 1.

Figure 3:
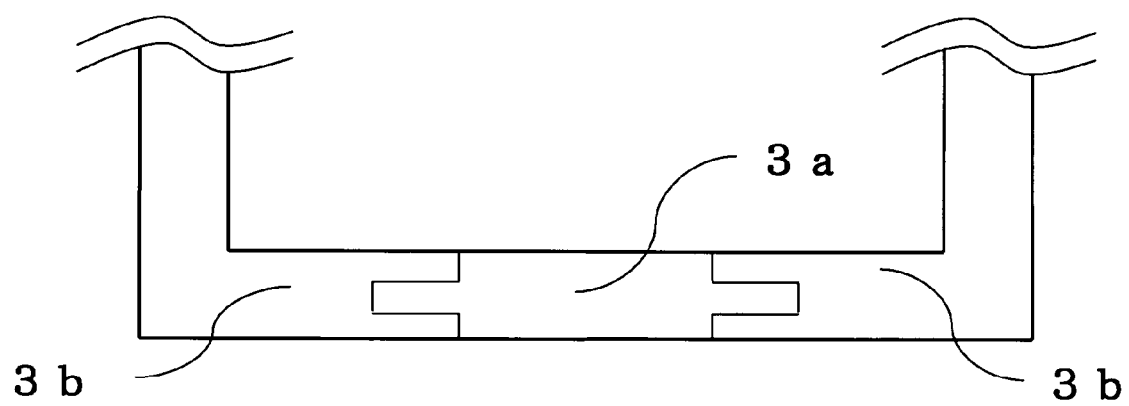
FIG. 3 is an enlarged partial view showing connecting portions of the molding device shown in FIG. 1.

FIG. 3 is an enlarged partial view showing connecting portions of the first side member (3a) and the second side members (3b) disposed adjacent to the first side member (3a).

As shown in FIG. 3, engaging end portions of the side members 3 adjacent to each other are provided with convex and concave portions, and the connecting portion between the side members 3 (3a, 3b) has a fitting structure, where end portions of the side members (3a) are provided with convex portions and end portions of the side members (3b) are provided with concave portions such that the convex portions of the first side members (3a) are inserted into the concave portions of the second side members (3b). The convex and concave portions described herein include various convex-type and concave-type forms and are structured to be connected or engaged each other. For example, the convex and concave portions shown in FIG. 3 have stepped-type convex and concave forms. Then, in the engaging end portions as shown in FIG. 1 and FIG. 3, the adjacent side members (3a, 3b) are connected to each other while supported by the convex portions.

In the molding device 1 of the embodiment as described above, no screws and bolts are used for fixing or assembling. For example, when retaining a molten silicon material in the molding device 1, since the density of silicon is 2.33 g/cm$^3$ in the solid state and 2.55 g/cm$^3$ in the liquid state, the specific gravity in the solid state is greater than that in the liquid state. Thus, the molten silicon material expands in volume when solidified. Therefore, when the molten silicon material is cooled and solidified inside the molding device 1, the side members 3 of the molding device 1 receive stress expanding toward the outside. However, in the embodiment according to the present invention, the side members 3 (3a, 3b) are connected to each other at the sides of the polygonal prism shape of the molding device 1, and thus when the members of the molding device are thermally expanded by increasing a temperature of the molding device 1, a force pressing in parallel with respect to the adjacent side members 3 is generated, and the strain borne by the connecting portions is reduced. As a result, when forming a silicon ingot, cracks originating from the vicinity of the connecting portions can be suppressed. Furthermore, in the molding device 1, no screws, bolts and threads are used, and thus the connections between the bottom member 2 and the side members 3 or connections between the side members (3a, 3b) do not have problems of coming loose due to breakage and wearing of the screws, bolts and threads. Accordingly, the molten silicon material in the molding device 1 is prevented from leaking during the cooling and solidification.

Also, the side members 3 and the bottom member 2 of the molding device 1 do not have screw threads for fixing screws, and thus there is no problem such as stripping of screw threads, which makes the members of a molding device, for example, made of an expensive material like graphite unusable. Accordingly, the cost of manufacturing a silicon ingot can be held down.

Furthermore, as compared to a molding device which requires many screws and bolts for fixing, the assembling and dissembling of the molding device 1 are significantly simple, thereby improving work efficiency.

Also, as shown in FIG. 1 and FIG. 3, it is preferable that the side members 3 include ones including at least one corner of the polygonal prism shape of the molding device 1 as in the second side member (3b). By providing the side members 3 having the corners of the polygonal prism shape of the molding device 1, when the members (2, 3) are thermally expanded by increasing a temperature of the molding device 1, the following effect can be expected. In a molding device having its connections at the corners, a large stress in the thickness direction of its side members is received by the connections, i.e., the corners of the molding device, due to expansion and shrinkage. However, in the molding device 1 according to the foregoing embodiment of the present invention, the side members 3 integrally include the corners of the polygonal prism shape of the molding device 1, and the stress applied at the corners are better withstood. Thus, looseness at the connections can be suppressed. Accordingly, the leakage of the molten material can be prevented.

Figure 4:
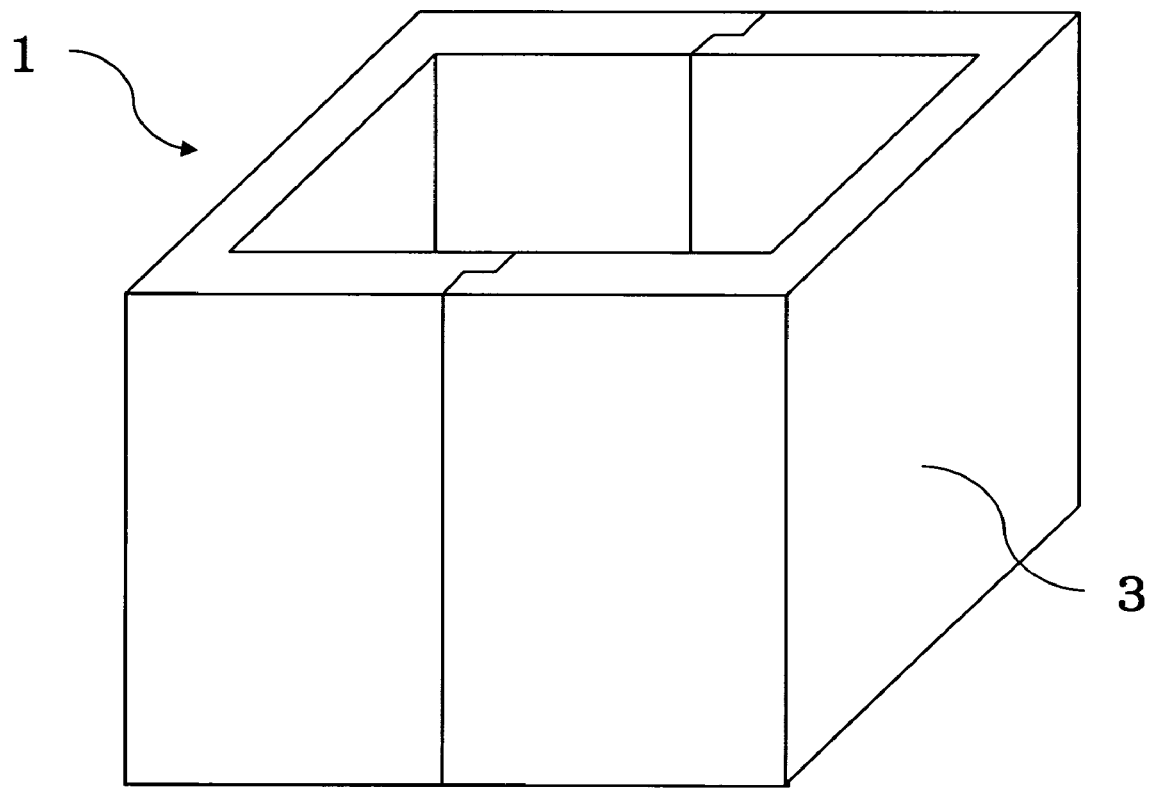
FIG. 4 is a perspective view of a molding device according to another embodiment of the present invention.
Figure 5:
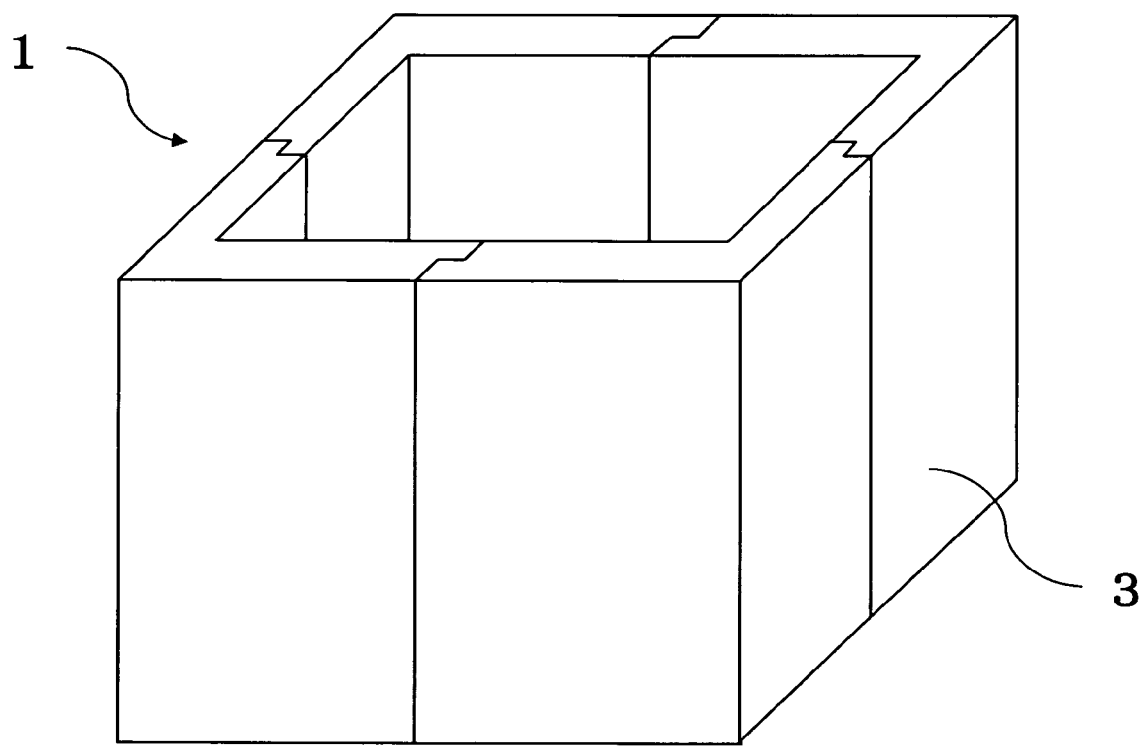
FIG. 5 is a perspective view of a molding device according to still another embodiment of the present invention.
Figure 6:
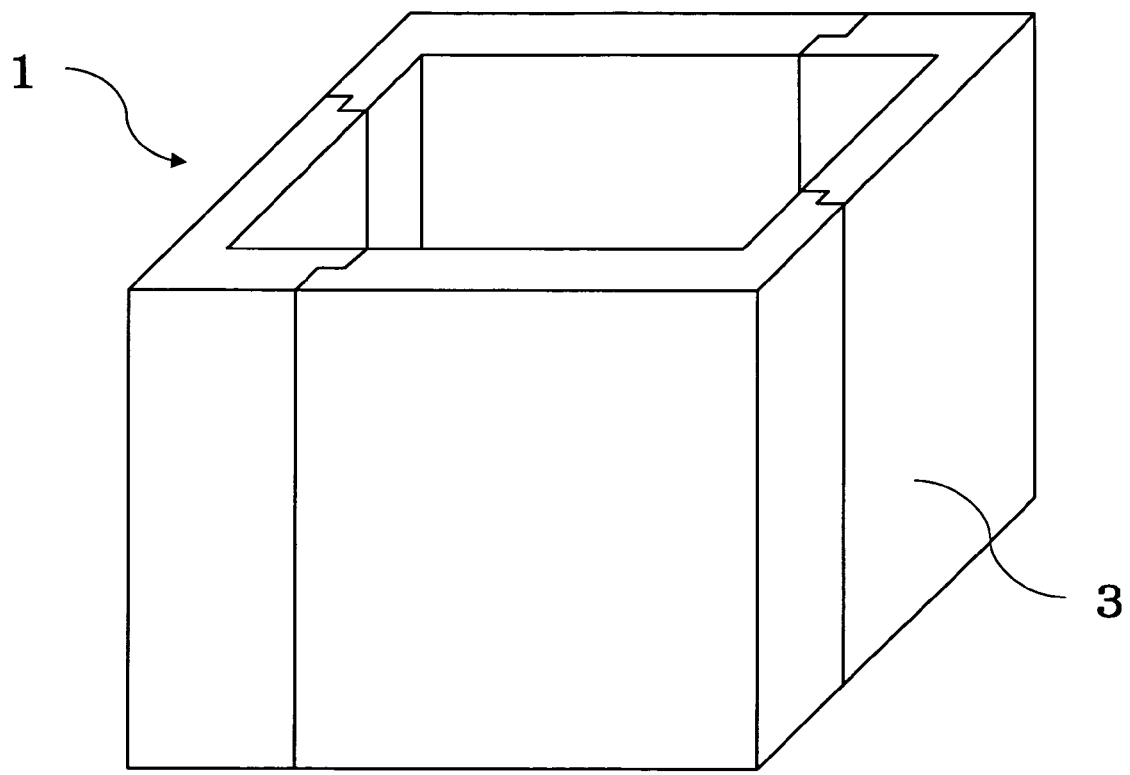
FIG. 6 is a perspective view of a molding device according to still another embodiment of the present invention.

FIG. 4 through FIG. 7 show perspective views of other embodiments of the present invention. For example, in a molding device with an inner dimension of 200 mm or less, rather than using the rectangular plates as the side members 3, the side members 3 may be U-shaped plates, i.e., three-sided plates, or L-shaped plates, i.e., two-sided plates, including the corners of the polygonal prism shape of the molding device 1, as shown in FIG. 4 through FIG. 6. With such side members 3, there is no need to prepare different shapes of side members separately, and thus it can be passed onto reduction of the cost of forming a silicon ingot. Also, in the molding device 1 as shown in FIG. 6, the positions of the connections are shifted from the middles of the sides of the polygonal prism shape. Since the middles of the sides of the polygonal prism shape are especially liable to receive the effect of expansion when a molten silicon material is solidified, by constructing the connecting portions in a manner that their positions are shifted from the middles of the sides of the polygonal prism shape, stress applied to the connecting portions can be moderated. By using such molding devices with the inner dimension of 200 mm or less, small-sized silicon ingots can be formed.

Figure 7:
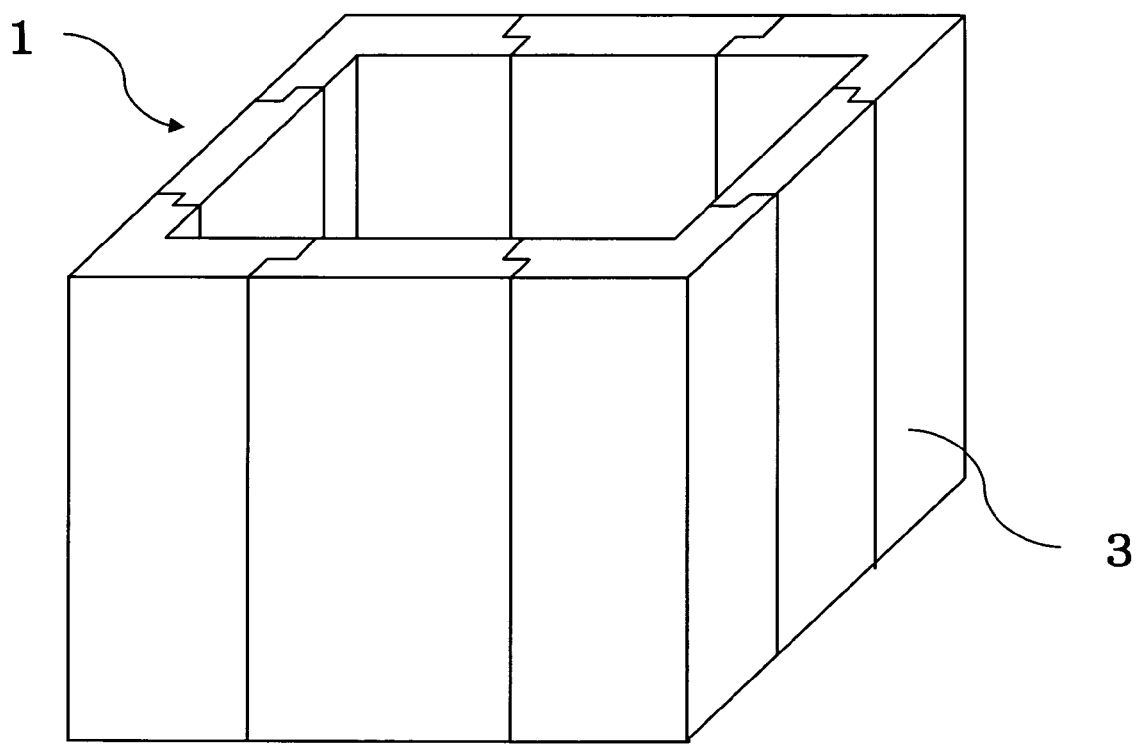
FIG. 7 is a perspective view of a molding device according to still another embodiment of the present invention.

Also, for example, in the case of a molding device with the inner dimension of 500 mm or more, the side members 3 may be rectangular plates and L-shaped plates as in the molding device 1 of one embodiment shown in FIG. 7. By using such a molding device with the inner dimension of 500 mm or more, large-sized silicon ingots can be formed.

Figure 8:
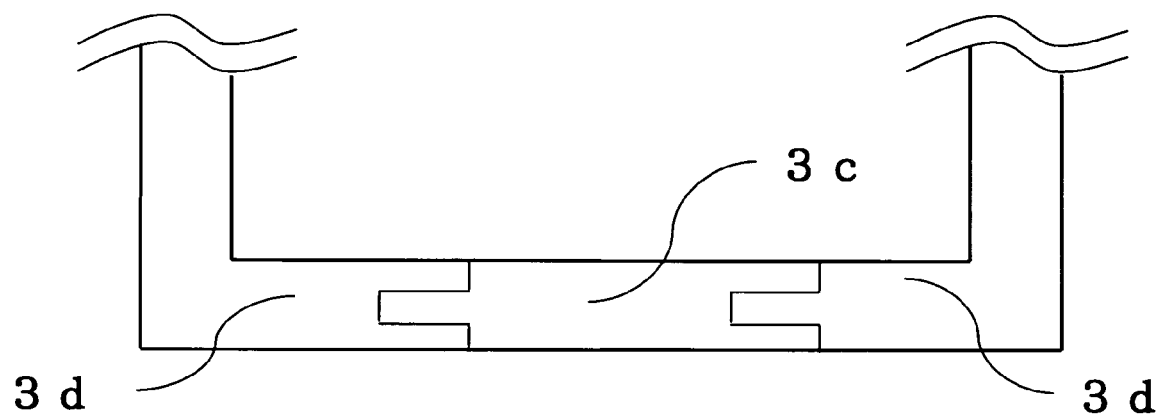
FIG. 8 is an enlarged partial view showing connecting portions of a molding device according to still another embodiment of the present invention.
Figure 9:
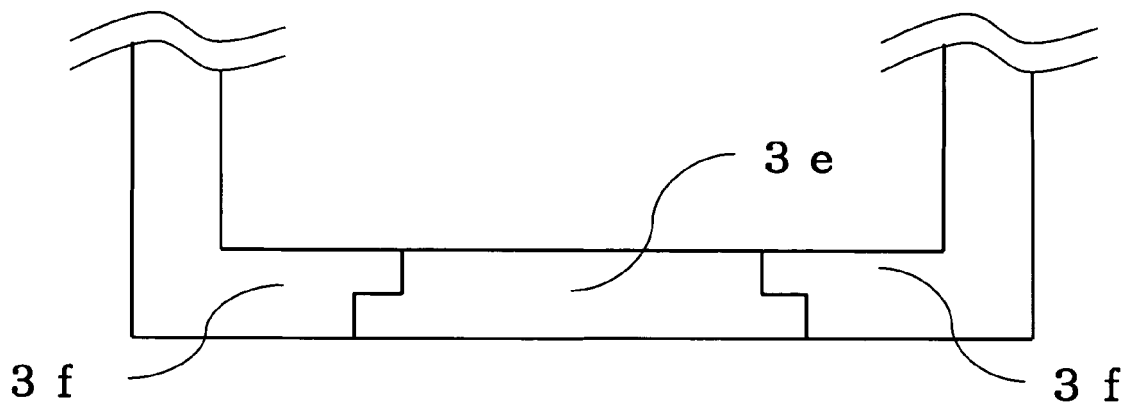
FIG. 9 is an enlarged partial view showing connecting portions of a molding device according to still another embodiment of the present invention.
Figure 10:
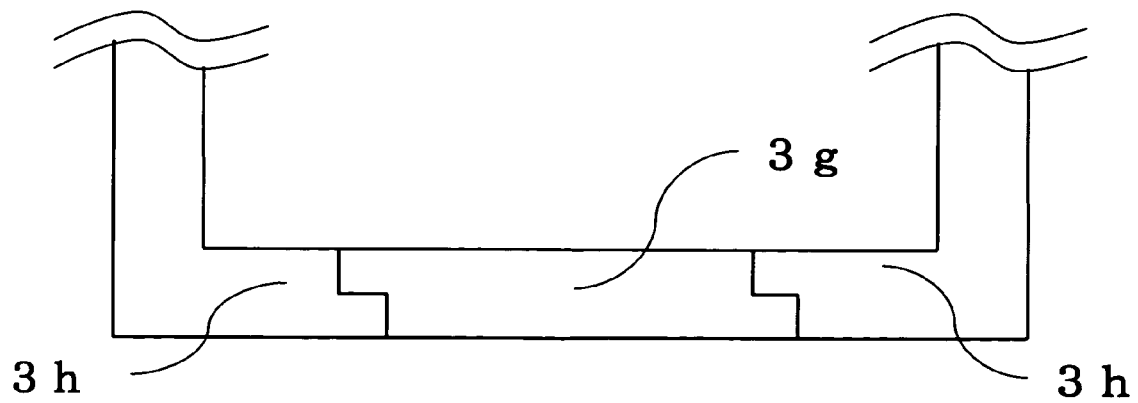
FIG. 10 is an enlarged partial view showing connecting portions of a molding device according to still another embodiment of the present invention.

FIG. 8 through 10 show enlarged partial views showing connecting portions of molding devices according to other embodiments of the present invention. FIG. 8 is an enlarged partial view showing connections between a first side member (3c) and second side members (3d) adjacent to the first side member (3c); FIG. 9 is an enlarged partial view showing connections between a first side member (3e) and second side members (3f) adjacent to the first side member (3e); and FIG. 10 is an enlarged partial view showing connections between a first side member (3g) and second side members (3h) adjacent to the first side member (3g).

In FIG. 8 through FIG. 10, the side members (3c, 3e, 3g) are connected to the side members (3d, 3f, 3h), respectively, at the sides of the polygonal prism shape of the molding device 1. The side members (3c, 3d, 3f, 3g, 3h) have engaging end portions provided with convex, concave, projecting and recessed portions, and in FIG. 8, the convex portions of the first side member (3c) and the second side members (3d) are inserted into their adjacent concave portions of the second side members (3d) and first side member (3c), thereby constructing a fitting structure. Then, in the engaging end portions shown in FIGS. 9 and 10, the first side members (3e, 3g) and their adjacent second side members (3f, 3h) are connected to each other while being supported by the shapes of their projecting and recessed portions.

For example, the connections between the side members (3a, 3b) in FIG. 3 have a fitting structure in which the first side member (3a) is provided with the ends having the convex portions and the second side member (3b) is provided with the ends having the concave portions. Thus, to increase the strength of the engaging end portions of the side members 3, it is preferable to have a certain thickness in the side member 3. On the other hand, if thinner side members are required, the engaging end portions of the first and second side members (3e, 3f, 3g, 3h) may be provided with L-shaped projecting and recessed portions as shown in FIGS. 9 and 10 for their connections. Processing of such engaging end portions are simpler compared to those of the side members (3a, 3b) in FIG. 3, and a thinner molding device can be obtained. Also, the cost of forming the molding device 1 can be reduced.

Also, the side members 3 adjacent to each other can be connected by sliding along the engaging end portions. For example, when the engaging end portions of the second side members (3b, 3d, 3f, 3h) adjacent to the first side members (3a, 3c, 3e, 3g) having the engaging end portions with the concave or recessed portions are provided with the convex or projecting portions, these engaging end portions of the adjacent side members can be engaged with each other in a sliding manner.

Also, in the case of a bottom member 2 having a wider surface than the bottom of the polygonal shape of the molding device 1, by providing a groove having a width almost equal to the thickness of the side members 3 in the bottom member 2, the side members 3 may be elected vertically by engaging with the groove, and the molding device 1 can be assembled by sliding the side members 3 into the groove. For example, in FIG. 9, if the second side members (3f) are fixed on the bottom member 2, the first side member (3e) can be slid from the above and fitted with the second side members (3f), or vice versa. Further, the side members 3 may not be fixed on the bottom member 2 in advance. For example, after assembling the first side members (3e) and the second side members (3f), the assembled side members 3 may be fixed onto the bottom member 2.

As a result, at the time of assembling the molding device, the working efficiency is improved, and not only the molding device can be easily assembled without using screws, but also the assembling steps can be reduced as compared to those requiring screws.

Figure 11:
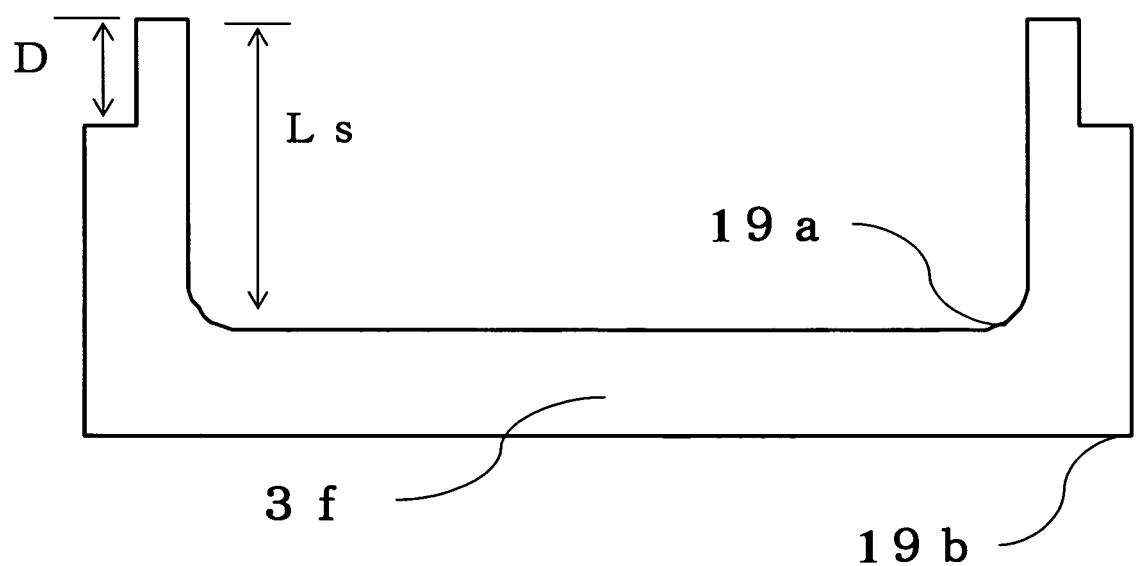
FIG. 11 is a plan view showing a side member of a molding device according to an embodiment of the present invention.

FIG. 11 is a plan view showing a side member of a molding device according to an embodiment of the present invention. In FIG. 11, a length (Ls) of a shorter side of a second side member (3f) is shown in its inner surface and a length (D) of an L-shaped portion is shown. As shown in FIG. 11, by setting the length (Ls) of the shorter side of the inner surface longer than the length (D) of the L-shaped portion, cracking in the vicinity of the connections can be prevented when the members are thermally expanded due to an increase in a temperature of a molding device. It is preferable that the length (D) of the L-shaped portion is 5 mm or more and 30 mm or less. Thus, the side members 3 can be prevented from collapsing inwardly during assembly. For example, if the length (D) of the L-shaped portion as shown in FIG. 11 is less than 5 mm, the first side member (3e) and the second side members (3f) thermally expand when a temperature of the molding device 1 is increased, and the first side member (3e) which has a rectangular plate shape may collapse inwardly. Also, if the length (D) of the L-shaped portion is set more than 30 mm, the L-shaped portion become more susceptible to breaking or chipping during handling of the second side member (3f). Accordingly, the cost of the side members 3 may increase.

Also, the sliding direction of a side member 3 may not be the vertically downward direction. That is, a side member 3 may be slid in a direction other than the one perpendicular to the bottom member 2. An engaging end portion of a side member 3 may have a structure in which the length (D) shown in FIG. 11 becomes longer from the top of the molding device 1 toward the bottom member 2. Thus, a side member 3 may be slid in a slanting fashion.

Also, as shown in FIG. 11, an inner corner (19a) of the molding device 1 may be formed in an R-shape, and so the corners of a silicon ingot may have an R-shape. Accordingly, in subsequent cutting processes, chamfering of the silicon ingot's corners can be eliminated, thereby simplifying its processing. Further, when a molten silicon material is solidified and cooled rapidly, it is more likely to cause cracking at the corners of a silicon ingot. However, by providing such R-shaped corners, the occurrence of cracking can be suppressed. It is preferable that the radius of an R-shape is 10 mm or more and 50 mm or less. Also, an outer corner (19b) of the molding device 1 can be either the right angle, i.e., 90°, or an R-shaped form; however, since the corners are normally apt to get cooled, it is preferable to have a greater thickness from the inner corner (19a) toward the outer corner (19b). Thus, the right angle is preferable at the outer corner (19b). Also, an outer circumference of the molding device 1 may be provided with a heat-insulating member using materials having, for example, carbon, as its main component.

Figure 12:
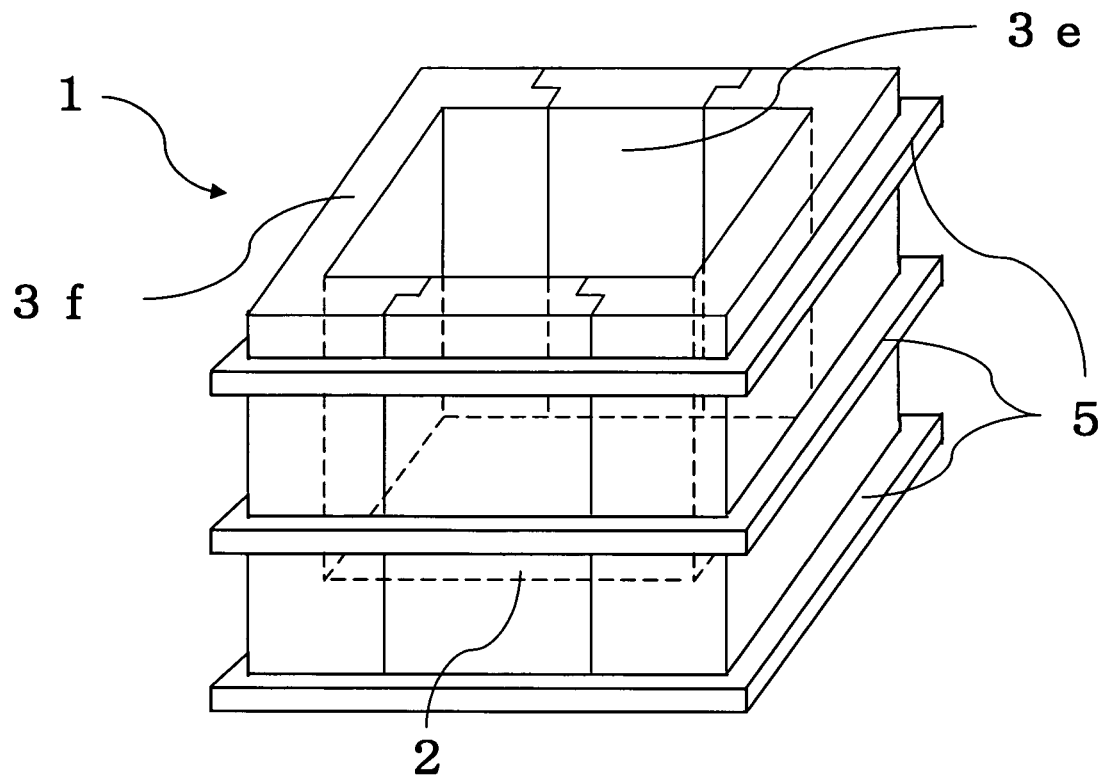
FIG. 12 is a perspective view showing a circumferential fixing device of a molding device according to an embodiment of the present invention.
Figure 13:
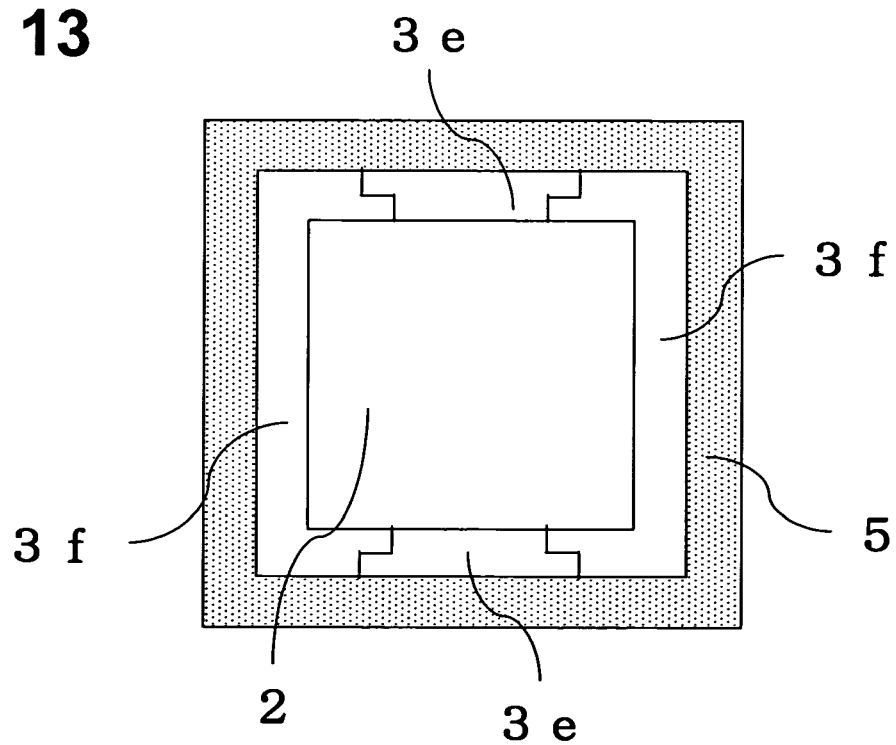
FIG. 13 is a plan view of the circumferential fixing device shown in FIG. 12, as seen from the above.

FIG. 12 is a perspective view showing fixing devices of a molding device according to an embodiment of the present invention, and FIG. 13 is a plan view of a fixing device shown in FIG. 12, as seen from the above.

FIG. 12 shows fixing devices 5 which are circumferentially disposed around side members (3e, 3f) of a molding device 1. As shown in FIG. 12, the first side members (3e) and the second side members (3f) are assembled, and fixing devices 5 for restraining shifting of the side members (3e, 3f) are disposed around the outer circumference of the side surfaces of the molding device 1. By providing such a structure, the engaging end portions of the side members 3 are securely fixed with each other. Also, the connections between a bottom member 2 and the side members 3 are fixed, and a larger and thinner molding device 1 can be realized. Further, the fixing devices 5 are easily attached to and detached from the molding device 1, and the assembling and dissembling of the molding device 1 can be smoothly carried out.

The fixing device 5 can have a shape, for example, as shown in FIG. 13, which directly fitted and fixes the entire surfaces of the side members 3 or indirectly fitted and fixes the side members 3.

A material for the fixing device 5 is preferably, for example, a carbon fiber reinforced carbon material having a light weight and a high strength, and by setting the thickness of the fixing device 5 to be, for example, 3 mm to 10 mm, its handling is easy and a sufficient strength can be achieved. Also, due to the expansion accompanying solidification of a molten silicon material, upper portions of the side members 3 forming the molding device 1 tend to spread outward. Especially, in the case of making a molding device 1 taller in height and reducing the thickness of molding device components or members, the influence of the expansion is increased. Therefore, it is preferable that the fixing device 5 is disposed within 4 cm from the top of the molding device 1.

Figure 14:
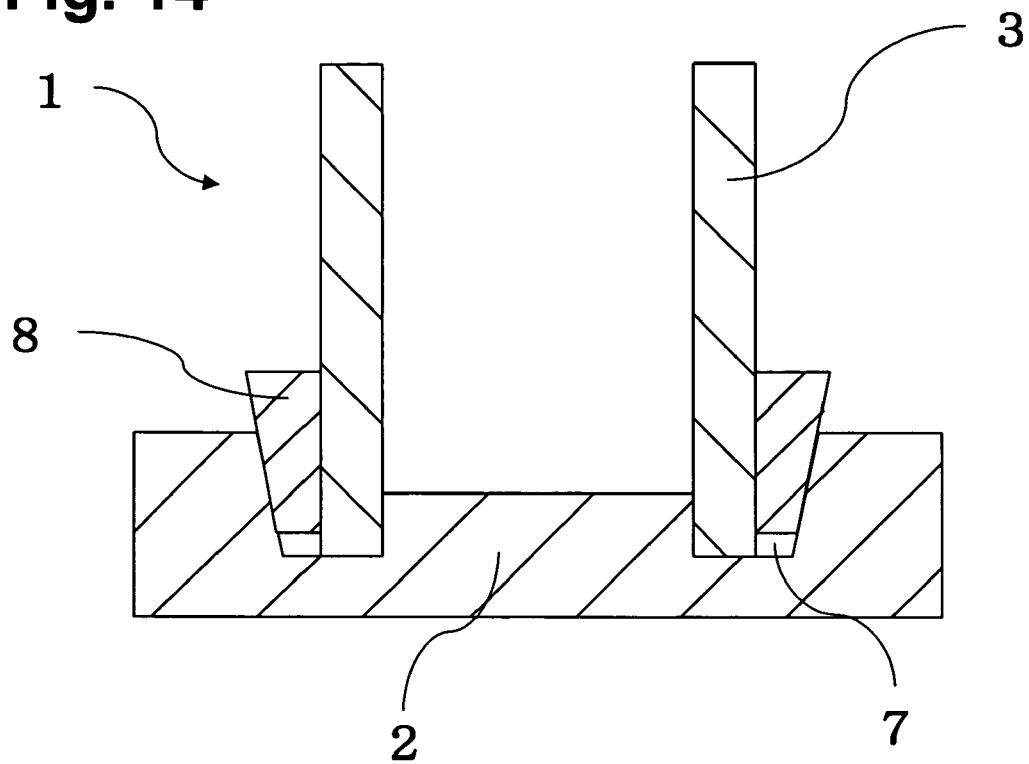
FIG. 14 is a cross-sectional view showing a bottom member of a molding device with a groove according to an embodiment of the present invention.
Figure 15:
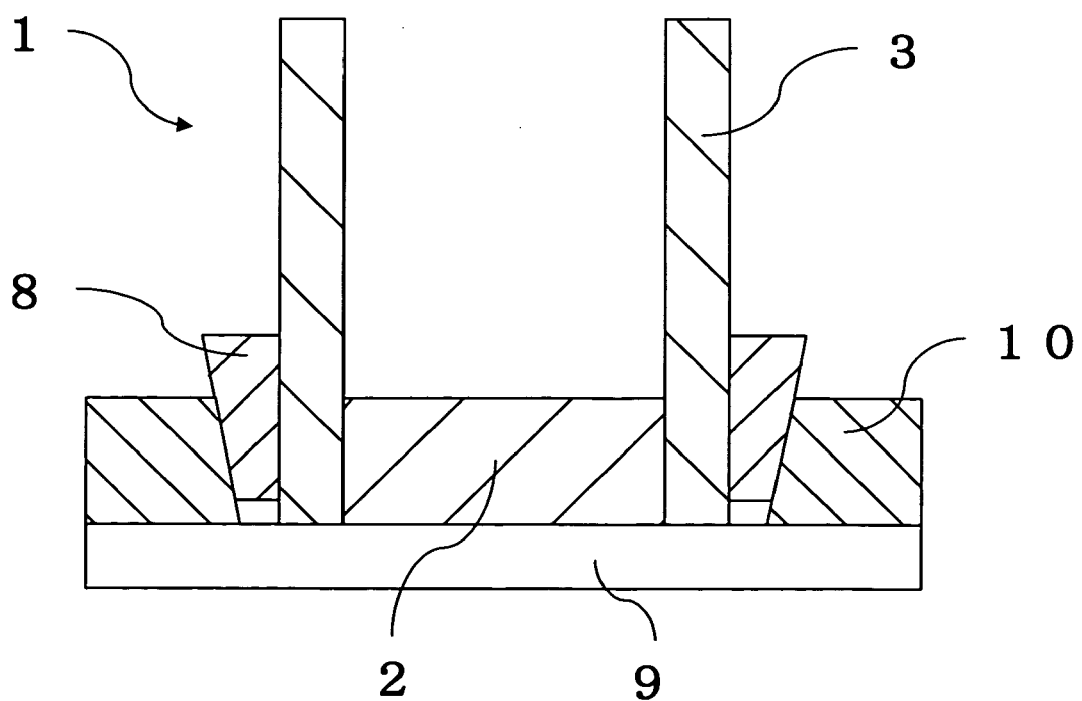
FIG. 15 is a cross-sectional view showing a bottom member, side members, and a molding holder of a molding device according to an embodiment of the present invention.

FIG. 14 is a cross-sectional view showing a bottom member of a molding device provided with a groove according to an embodiment of the present invention, and FIG. 15 is a cross-sectional view showing a bottom member, side members, and a holder of a molding device according to an embodiment of the present invention.

FIGS. 14 and 15 show a bottom member 2, side members 3 of a molding device 1 abutting against the bottom member 2, and pressing members 8 disposed in gaps between the side members (3e, 3f) and the bottom member 2. As shown in FIGS. 14 and 15, for connection between the bottom member 2 and the side members 3, it is preferable to provide the gaps between the side members 3 and the bottom member 2. By providing these gaps, pressing members 8 can be inserted, and the molding device 1 and the circumferential fixing device 5 can be securely fixed to each other. Accordingly, the leakage of a molten silicon material can be prevented. Also, after the solidification in the molding device 1, by taking out the pressing members 8, the fixing device 5 can be easily detached from the molding device 1. Thus, as compared to a molding device in which many screws and bolts are required for fixing, the assembling and dissembling of the molding device 1 can be smoothly performed.

Also, as shown in FIG. 14, a groove 7 may be provided in the bottom member 2, and the side members 3 are disposed in the groove 7. The pressing members 8 are inserted into the gaps between the side members 3 and the bottom member 2 and further driven into the groove 7 to assemble the molding device 1. Alternatively, as shown in FIG. 15, the bottom member 2 may be disposed on a holder 9 provided with a frame member 10, and four side members 3 are positioned to surround the outer circumference of the bottom member 2. The holder 9 is structured to hold the bottom member 2 and the frame member 10, and the frame member 10 provides a frame for the connection between the bottom member 2 and the side members 3 on the holder. Then, by driving the pressing members 8 into a space between the outer surface of the side member 3 and the frame member 10, the molding device 1 is assembled.

Figure 16:
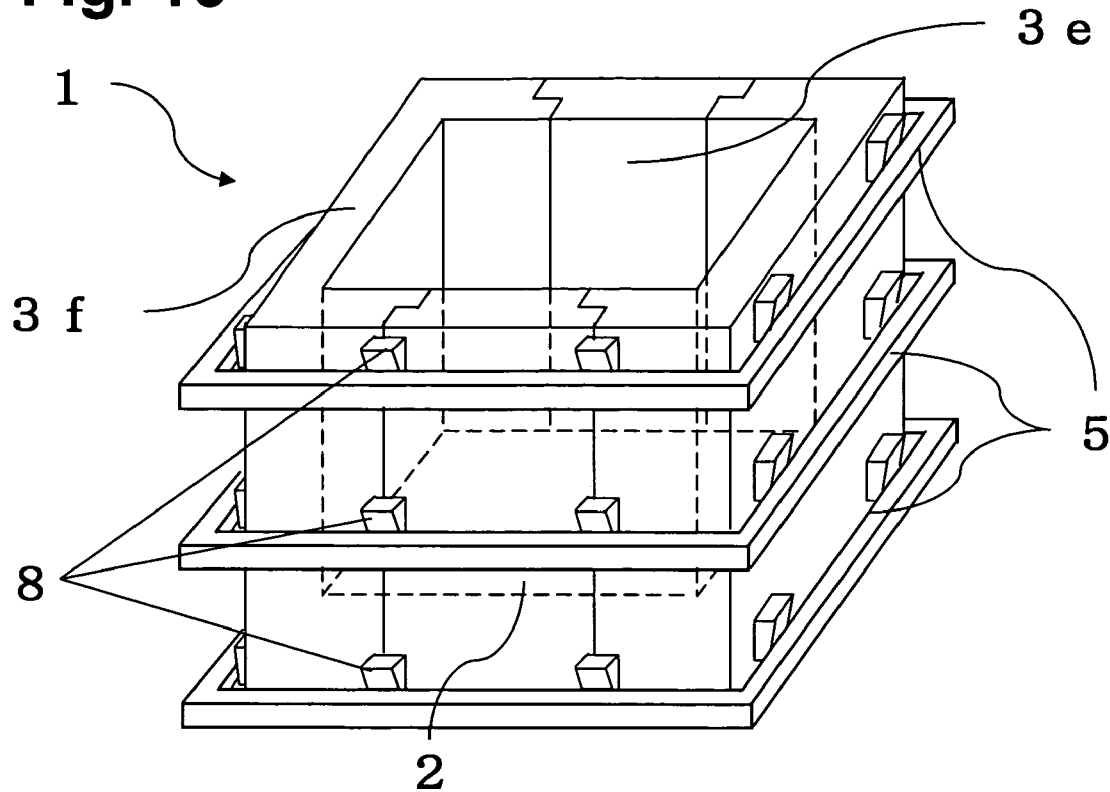
FIG. 16 is a perspective view showing circumferential fixing devices of a molding device according to another embodiment of the present invention.
Figure 17:
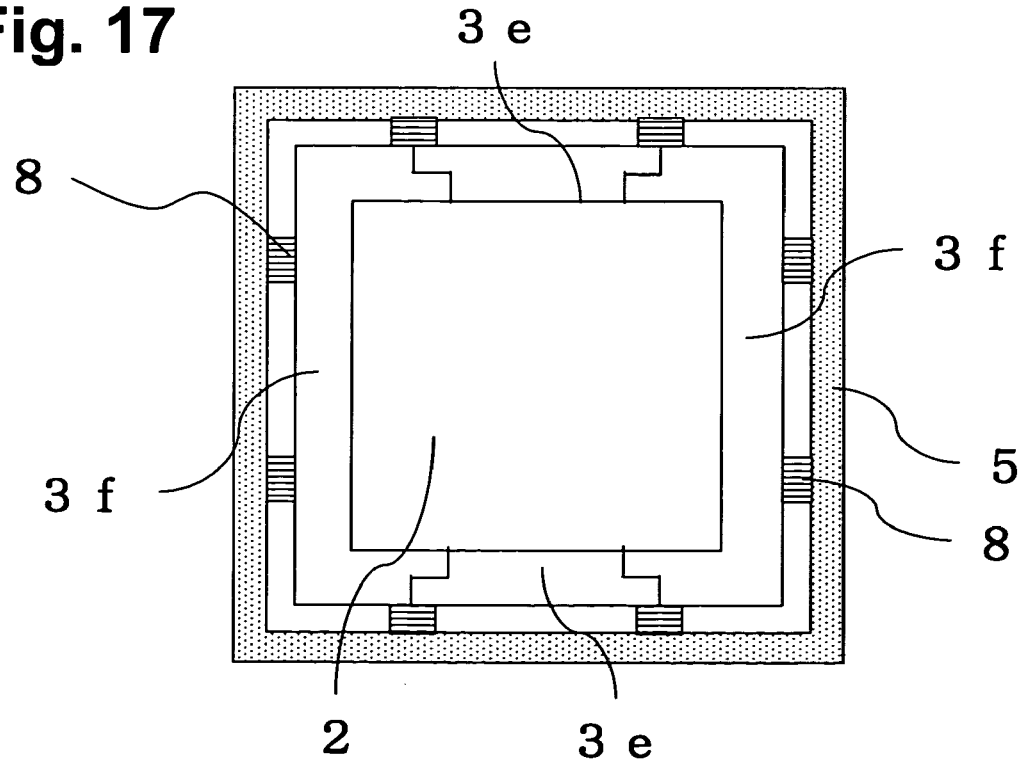
FIG. 17 is a plan view of the circumferential fixing device shown in FIG. 16, as seen from the above.

FIG. 16 is a perspective view showing fixing devices of a molding device according to another embodiment of the present invention, and FIG. 17 is a plan view of a fixing device shown in FIG. 16 as seen from the above.

In FIGS. 16 and 17, pressing members 8 are inserted between a molding device 1 and fixing devices 5. Accordingly, the molding device 1 and the fixing devices 5 are securely and indirectly fixed to each other, and even if first and second side members (3e, 3f) are made thinner, the molding device 1 is prevented from expanding outwardly due to the expansion caused by the cooling and solidification of a molten silicon material. Also, by taking out the pressing members 8, the fixing devices 5 are easily detached from the circumference of the molding device 1. Thus, as compared to a molding device in which many screws and bolts are required for fixing, the assembling and dissembling of the molding device 1 can be smoothly performed.

Further, as shown in FIG. 16, the pressing members 8 are disposed in the vicinity of the connections between first side member (3e) and second side member (3f), and thus the first side member (3e) is prevented from expanding outward due to the expansion caused by the cooling and solidification of a molten silicon material.

For example, the pressing members 8 may have a wedge-shaped form, and their tapered sides are inserted into a gap between the molding device 1 and the fixing device 5. Then, by driving the pressing members 8 into the gap for fixing, the side members 3 are more securely restrained. Further, by adjusting the driving of the pressing members 8, the strength of fixing the fixing devices 5 may be adjusted.

Figure 18:
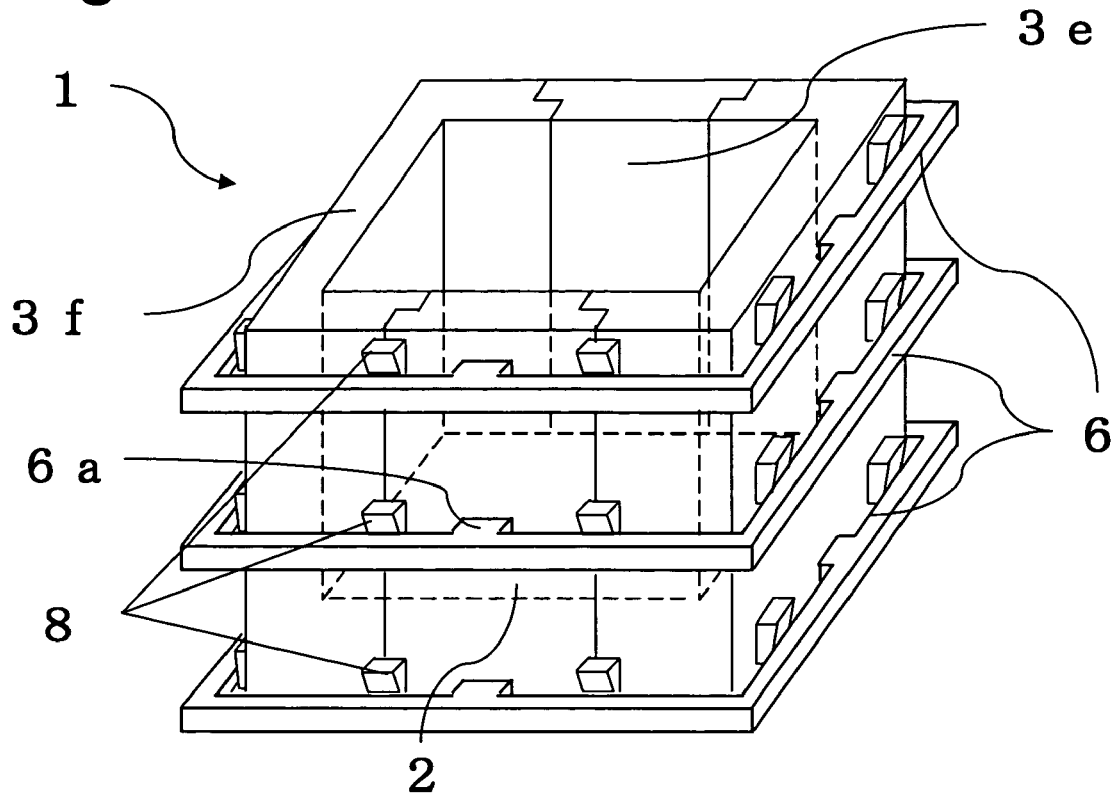
FIG. 18 is a perspective view showing circumferential fixing devices of a molding device according to another embodiment of the present invention.
Figure 19:
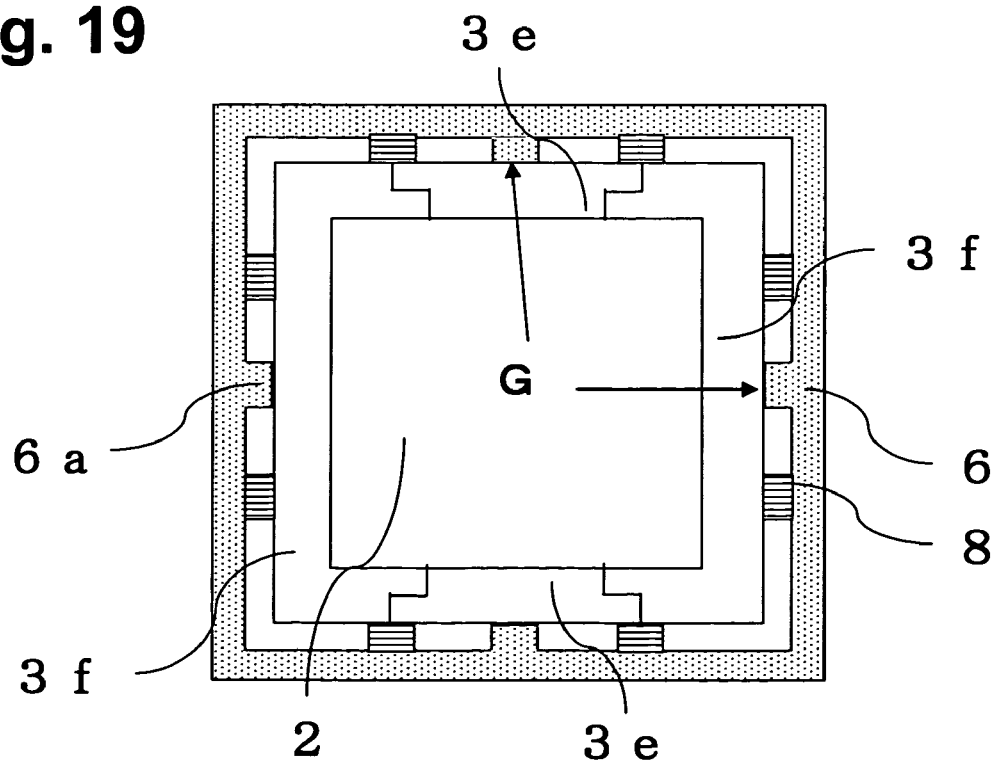
FIG. 19 is a plan view of the circumferential fixing device shown in FIG. 18, as seen from the above.

FIG. 18 is a perspective view showing fixing devices of a molding device according to another embodiment of the present invention, and FIG. 19 is its plan view as seen from the above.

As shown in FIG. 18, fixing devices 6 provided with projecting portions (6a) are circumferentially disposed around the side members (3e, 3f), and the projecting portions (6a) are positioned to make contact with first and second side members (3e, 3f) at one point for each of the side members (3e, 3f). The projection portions (6a) may be provided at two, three or more points, and the projection portions (6a) may be positioned to make contact with the side members (3e, 3f) at multiple points. In the case of pressing at two points, a straight line connecting the two points runs through the center (G). In the case of pressing at three or more points, the center (G) may be contained within a graphic shape defined by connecting these points, and thus the projecting portions (6a) effectively press toward the center (G).

Further, a mold release material may be coated on the inner surface of the molding devices 1 according to the aforementioned embodiments of the present invention. By providing a mold release material made of, for example, silicon nitride, silicon dioxide, or silicon carbide, the inner walls of the molding devices 1 is prevented from fusing with a silicon ingot after the solidification. Also, since the connections between the bottom member 2 and the side members 3 are sealed by coating a mold release material, leakage of a molten silicon material is reduced. Further, in a molding device whose connections are formed at the corners, it is difficult to evenly coat the mold release material on the corners, the connections are not effectively sealed, making susceptible to leakage of a molten silicon material. To prevent this problem, an excessively large amount of the mold release material may be required to be coated. However, in the molding devices 1 according to the above-described embodiments of the present invention, the connections are located at the sides of the polygonal prism shape of the molding devices 1, the mold release material is evenly coated over the connections, and the connections are sealed without an excessive coating of the mold release material.

In a molding device which requires screws and bolts for fixing, a material for its components or members is selected so as to enable additional process for attaching the screws and bolts, and a graphite material has been used for its components or members. However, in the above-described embodiments according to the present invention, such complicated processes are not carried out, and structures of components or members may be extremely simplified. Therefore, a material for its components or members is not limited to a graphite material, but various heat resistant materials such as fused silica, silicon nitride, and silicon carbide may be used.

A method of forming a silicon ingot by using the molding devices 1 of the aforementioned embodiments according to the present invention is explained below.

Figure 20:
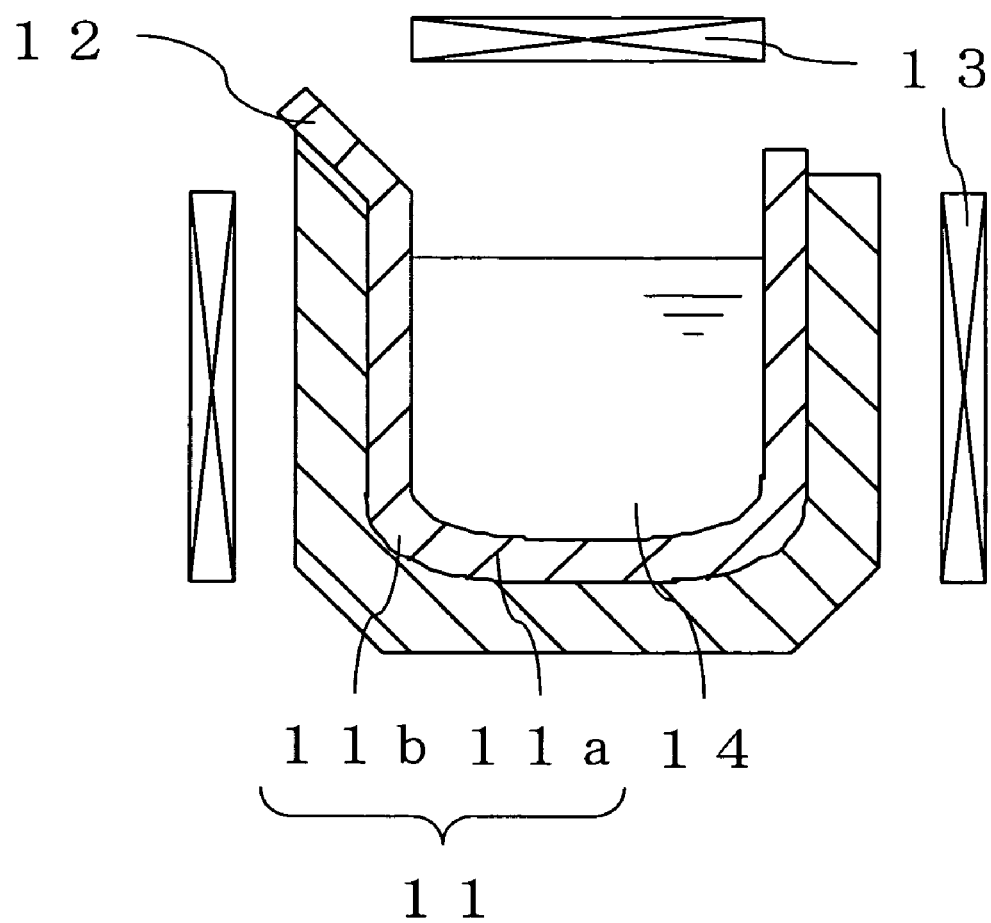
FIG. 20 is a cross-sectional view of a crucible of an exemplary casting device for forming a silicon ingot, in which a molding device according to an embodiment of the present invention is used.
Figure 21:
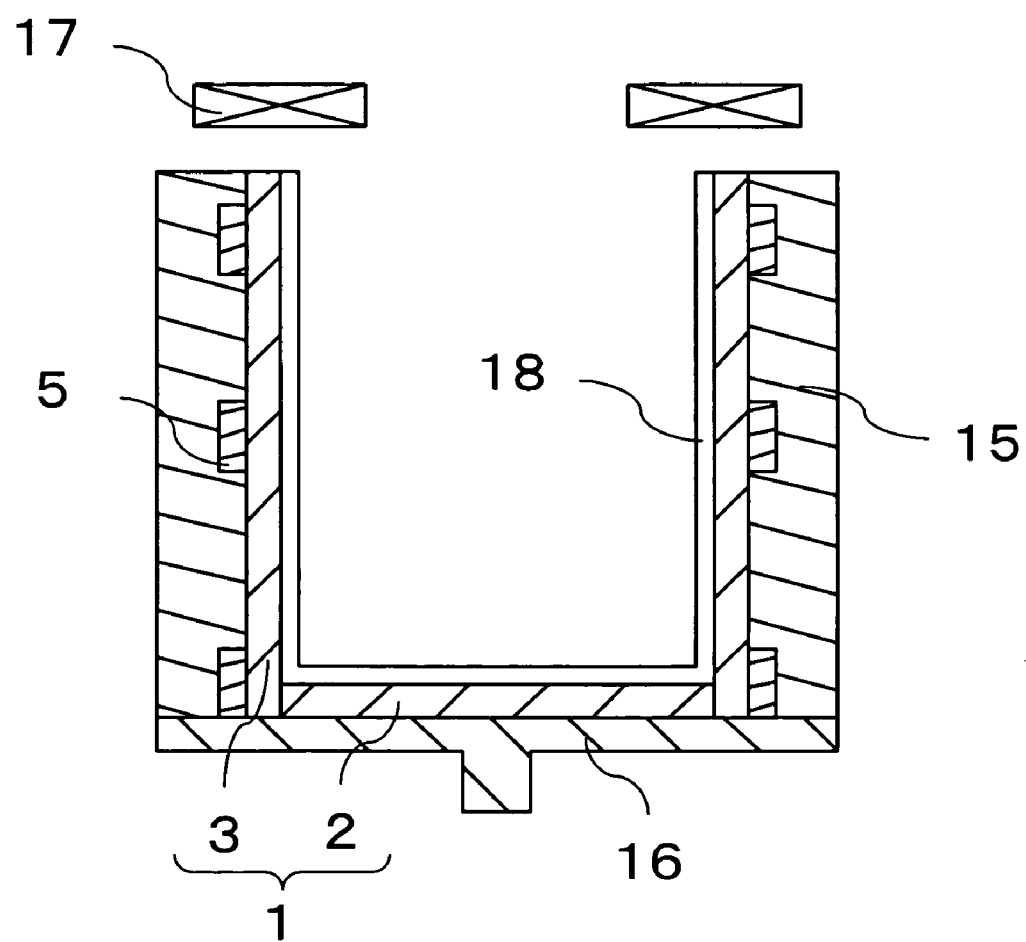
FIG. 21 is a cross-sectional view of an exemplary casting device and a molding device according to an embodiment of the present invention.

FIG. 20 is a cross-sectional view of an exemplary crucible and an exemplary casting device used in a method of forming a silicon ingot. FIG. 21 is a cross-sectional view of a casting device and a molding device according to an embodiment of the present invention.

First, a raw silicon material in a crucible 11 is heated by using a heating device 13 such as an electrical resistance heater and an induction heating coil, and the raw silicon material is molten to provide a molten silicon material. For the heat performance and prevention of impurity diffusion into the molten silicon material, a high purity quartz, for example, may be used for a melting crucible (11a). A retaining crucible (11b) is provided for holding the melting crucible (11a) since the melting crucible (11a) made of quartz, for example, is softened due to a high temperature in the vicinity of the molten silicon material and becomes difficult to keep its shape. As a material for the retaining crucible (11b), for example, graphite may be used. Then, the molten silicon material 14 is supplied to a molding device 1. For example, in FIGS. 20 and 21, by tilting the crucible 11, the molten silicon material is poured from a pouring outlet 12 of the crucible 11 into the molding device 1 positioned below. Thereafter, while keeping a high temperature in the upper portion of the molding device 1, the lower portion of the molding device 1 is cooled, and so the supplied molten silicon material 14 is solidified from one direction from the lower side, thereby forming a silicon ingot. In forming a silicon ingot, a heat-insulating member 15 made of, for example, a carbon type material, is disposed around the molding device 1 to control heat removal, a cooling plate 16 is disposed under the molding device 1 for cooling and solidifying the molten silicon material, and an upper side heating device 17 is provided for heating the surface of the molten silicon material from the upper side of the molding device 1. Thus, the molten silicon material is solidified in one direction from the lower side toward the upper side of the molding device 1.

The above processes may be carried out without using the crucible 11. For example, a silicon raw material may be molten in the molding device 1, and a silicon ingot may be formed in the molding device 1. Also, for the cooling and solidifying, rather then, using cooling device such as the cooling plate 16, the molten silicon material may be cooled simply by sitting.

When a silicon ingot is formed by using the molding devices 1 according to the aforementioned embodiments, cracking occurring in the vicinity of the connections due to the thermal expansion of the molding members can be prevented, for example, at the time of retaining the molten silicon material at about 1400 ° C. Also, since cracks due to the thermal expansion can be prevented, the manufacturing conditions such as heating conditions and cooling conditions of the molding device 1 become more flexible. Furthermore, in using a material which expands when solidified, such as silicon, when a molten material is cooled and solidified, stress toward the outside is applied to the side members of a molding device. However, by using the molding devices 1 according the aforementioned embodiments, the leakage of the molten material can be prevented.

In the above explanations, the examples of retaining and solidifying a molten silicon material are provided, but the present invention is not limited to a molten silicon material. Effects and advantages similar to what are described above can be expected when other similar materials are used.

EXAMPLE

When a molding device assembled by using screws is compared with the molding device 1 according to the embodiment of the invention shown in FIG. 16, the following result may be expected.

A bottom member (20 mm in thickness) and four side members (20 mm in thickness), made of graphite and coated with a mold release material made of silicon nitride, may be assembled into a box shape, and fixed by forty screws (ø5 mm×40 mm in length), thereby obtaining a molding device (350 mm×350 mm in inner dimension×350 mm in height). Then, 90 kg of a molten silicon material is poured into the molding device obtained as described above, and by gradually decreasing a temperature of the molten silicon material from the bottom of the molding device, it is expected that a silicon ingot with 315 mm in height can be obtained.

For the molding device according to the embodiment of the present invention as shown in FIG. 16, the bottom member 2 (10 mm in thickness), two first side members (3e) and two second side members (3f) (10 mm in thickness), made of graphite and coated with a mold release material made of silicon nitride and having 2 mm in thickness, may be assembled on the holder 9, thereby obtaining a box shape. The fixing devices 5 and the pressing members 8 may be disposed as shown in FIG. 16. The molding devices 1 may be prepared such that some of them may have the length (Ls) of the second side member (3f) equal to or less than the length (D) of the L-shaped portions of the first and second side members (3e, 3f), i.e., Ls s D, and others may have the length (Ls) longer than the length (D), i.e., Ls>D as shown in FIG. 11. The length (D) of the L-shaped portions of the first and second side members (3e, 3f), that is, the distance (D) shown in FIG. 11, may be changed in the range of 0.5 mm to 40 mm.

Then, 90 kg of a molten silicon material is poured into the molding devices 1 obtained as described above, and by gradually decreasing a temperature from the bottom of the molding devices 1, it is expected that the molten silicon material is solidified from one direction, and that a silicon ingot with about 315 mm in height can be obtained.

Casting processes according to the above methods may be repeated ten times, and the presence or absence of leakage of the molten silicon material and wearing of the members in each case may be compared. The wearing may include chipping or cracking of the members during their handing. Table 1 below shows some result which can be expected from the exemplary comparison.

TABLE 1

| Ls | D | Leakage of the molten silicon material (times) | Breakage of the molding device (times) |
|---|---|---|---|
| Conventional structure | | 4 | 8 |
| Ls ≦ D | 0.5 | 3 | 5 |
| | 5 | 3 | 5 |
| | 15 | 2 | 4 |

TABLE 1-continued

| Ls | D | Leakage of the molten silicon material (times) | Breakage of the molding device (times) |
|---|---|---|---|
| | 30 | 2 | 5 |
| | 40 | 3 | 7 |
| Ls > D | 0.5 | 3 | 4 |
| | 5 | 0 | 0 |
| | 15 | 0 | 0 |
| | 30 | 0 | 0 |
| | 40 | 2 | 4 |

In the molding device using the screws, the leakage of the molten silicon material is expected to be observed about four times, and it is expected that the members are replaced due to the breakage of the screws and the wearing of the screw threads. The replacement due to the wearing of the screw threads in the bottom plate and side plates, and the replacement resulting from the broken screws embedded in the screw holes of the bottom plates and side plates are expected to be observed about eight times out of the total replacements of ten times.

In the molding devices 1 according to the embodiment of the present invention as shown in FIG. 16, for the ones with the length (Ls) equal to or less than the length (D), both the leakage of the molten silicon and the breakage of the molding device are expected to be observed less frequently as compared to the molding device using the screws. However, some leakage of the molten silicon material and breakage of the molding device may be observed. On the other hand, for the ones with the length (Ls) of the second side member (3f) longer than the length (D) of the L-shaped portions of the first and second side members (3e, 3f), that is, the length (D) shown in FIG. 11 is in the range of 5 mm to 30 mm, it is expected that the leakage of the molten silicon material is not observed and that there are no replacements of the members. Also, when the length (D) is 0.5 mm and 40 mm, although the leakage of the molten silicon material and the breakage of the molding device are expected to be observed, the leakage of the molten silicon material and the replacements are expected to be less frequent as compared to the molding device using the screws.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A molding assembly for forming an ingot, comprising:
   a plurality of side members each having plural engaging end portions, the plural engaging end portions of the side members being engaged with respective ones of the side members such that the side members form a polygonal prism having plural sides, plural corners, a top opening and a bottom opening; and
   a bottom member fitted to close the bottom opening of the polygonal prism so as to form a molding device,
   wherein the plural engaging end portions of the side members are in the plural sides of the polygonal prism when engaged to form the polygonal prism and form connecting portions extending between the top opening and bottom opening of the polygonal prism, and the molding device is configured to mold a molten material into an ingot.

2. The molding assembly of claim 1, wherein the plurality of side members includes side members having at least one of the corners of the polygonal prism.

3. The molding assembly of claim 1, wherein the plurality of side members includes single-sided side members and three-sided side members.

4. The molding assembly of claim 1, wherein the plurality of side members includes single-sided side members and two-sided side members.

5. The molding assembly of claim 1, wherein the plurality of side members includes two-sided side members.

6. The molding assembly of claim 1, wherein the plural engaging end portions of the side members comprise engaging end portions comprising convex portions and engaging end portions comprising concave portions.

7. The molding assembly of claim 1, wherein the plural engaging end portions of the side members comprise engaging end portions comprising projecting portions and engaging end portions comprising receiving portions configured to couple with the projecting portions.

8. The molding assembly of claim 3, wherein the plural engaging end portions of the side members comprise engaging end portions comprising projecting portions and engaging end portions comprising receiving portions configured to couple with the projecting portions, the projecting portions have a length from bases to tips of the projecting portions, and the length of the projecting portions is in a range of 5 mm to 30 mm.

9. The molding assembly of claim 1, further comprising at least one fixing device detachably fitted to a circumference of the polygonal prism.

10. The molding assembly of claim 9, further comprising at least one pressing device detachably disposed between the at least one fixing device and the circumference of the polygonal prism.

11. The molding assembly of claim 9, further comprising pressing means for pressing the polygonal prism, wherein the pressing means is detachably disposed between the at least one fixing device and the circumference of the polygonal prism.

12. The molding assembly of claim 1, further comprising a holder holding the molding device at a bottom surface of the molding device, a frame member provided on the holder to frame around a circumference of the molding device and at least one pressing member detachably disposed between the molding device and the frame member.

13. The molding assembly of claim 1, wherein the bottom member has a groove configured to be fitted with the side members and the polygonal prism is partially fitted into the groove.

14. The molding assembly of claim 13, further comprising at least one pressing member detachably fitted in a gap formed between the groove and a circumference of the polygonal prism.

15. The molding assembly of claim 1, wherein the side members and bottom member comprise graphite.

16. The molding assembly of claim 1, wherein the side members and bottom member comprise a heat resistant material selected from the group consisting of fused silica, silicon nitride and silicon carbide.

17. The molding assembly of claim 1, wherein the molding device is configured to mold a molten silicon material into a silicon ingot.

18. The molding assembly of claim 1, wherein the molding device has inner surfaces configured to contain the molten material and the inner surfaces are coated with a mold release material.

19. The molding assembly of claim 18, wherein the mold release material comprises at least one material selected from the group consisting of silicon nitride, silicon dioxide, and silicon carbide.

20. The molding assembly of claim 1, wherein the plural engaging end portions of the side members are configured to detachably engage with respective ones of the side members, and the bottom member is configured to be detachably fitted to close the bottom opening of the polygonal prism.

21. A molding assembly for forming an ingot, comprising:
a plurality of side members having engaging means for engaging with respective ones of the side members to form a polygonal prism having plural sides, plural corners, a top opening and a bottom opening; and
a bottom member fitted to close the bottom opening of the polygonal prism so as to form a molding device,
wherein the engaging means of the side members is in the plural sides of the polygonal prism when engaged to form the polygonal prism and forms connecting portions extending between the top opening and bottom opening of the polygonal prism, and the molding device is configured to mold a molten material into an ingot.

* * * * *